US007755385B2

(12) United States Patent
Sreeramaneni

(10) Patent No.: US 7,755,385 B2
(45) Date of Patent: *Jul. 13, 2010

(54) METHOD FOR OPERATING AN ELECTRONIC DEVICE WITH REDUCED PIN CAPACITANCE

(75) Inventor: Raghukiran Sreeramaneni, Andhra Pradesh (IN)

(73) Assignee: Micron Technology, Inc., Boise, ID (US)

( * ) Notice: Subject to any disclaimer, the term of this patent is extended or adjusted under 35 U.S.C. 154(b) by 88 days.

This patent is subject to a terminal disclaimer.

(21) Appl. No.: 12/341,043

(22) Filed: Dec. 22, 2008

(65) Prior Publication Data

US 2009/0108867 A1 Apr. 30, 2009

Related U.S. Application Data

(63) Continuation of application No. 11/738,473, filed on Apr. 21, 2007, now Pat. No. 7,482,833.

(51) Int. Cl.
*H03K 17/16* (2006.01)
*H03K 19/003* (2006.01)

(52) U.S. Cl. ............................. 326/30; 326/58; 326/87; 327/112; 365/189.05; 365/191

(58) Field of Classification Search .................... 326/30, 326/56–58, 82–83, 86–87; 327/108–109, 327/112; 365/189.02, 189.05, 191
See application file for complete search history.

(56) References Cited

U.S. PATENT DOCUMENTS

| 6,396,300 | B1 | 5/2002 | Longhmiller et al. |
| 6,492,853 | B1 | 12/2002 | Latham et al. |
| 6,642,740 | B2 | 11/2003 | Kim et al. |
| 6,686,765 | B2 * | 2/2004 | Ruesch ........................ 326/30 |

(Continued)

OTHER PUBLICATIONS

Tom Kinsley, "DDR2: The New DRAM Standard", Micron Technology, Inc., Boise, ID, 2006 month n/a, pp. 1-10.
Micron Designline, "DDR2 Offers New Features and Functionality", vol. 12, Issue 2, 3Q03, quarterly publication, Micron Technology, Inc., Boise, ID, pp. 1-16, 2003 month n/a.

(Continued)

*Primary Examiner*—James H. Cho
*Assistant Examiner*—Jason Crawford
(74) *Attorney, Agent, or Firm*—Stephen A. Gratton

(57) ABSTRACT

A method of operating an electronic device having an output driver with on die termination legs ODT, and non-ODT legs, includes the step of selectively tri-stating tuning transistors (ZQ trim devices) in the legs as a function of the operational state of the output driver. The tri-stating step is performed such that when a leg is not being utilized, the tuning transistors in the unused leg are placed in a tri-state. For example, during an ODT mode of the output driver, the tuning transistors in the non-ODT legs are tri-stated. During a READ mode of the output driver, the tuning transistors in the ODT legs are tri-stated. During a HiZ mode of the output driver, the tuning transistors in both legs are tri-stated. Tri-stating the tuning transistors in the unused output driver legs can reduce DQ pin capacitance by a total of approximately ($C_{gd}+C_{gs}+C_{gb}$). A circuit for performing the method includes tri-state components in electrical communication with the tuning transistors, and logic units configured to control the tri-state components. An electronic device includes the output driver having the tri-state components in electrical communication with the logic units.

20 Claims, 4 Drawing Sheets

U.S. PATENT DOCUMENTS

| | | | |
|---|---|---|---|
| 6,812,734 B1* | 11/2004 | Shumarayev et al. | 326/30 |
| 6,839,286 B2 | 1/2005 | Cho et al. | |
| 6,967,826 B2 | 11/2005 | Roohparvar | |
| 7,151,700 B2 | 12/2006 | Ba | |
| 7,164,600 B2 | 1/2007 | Ba | |
| 7,176,729 B2 | 2/2007 | Hayashi | |
| 7,319,621 B2 | 1/2008 | Ba | |
| 7,482,833 B2* | 1/2009 | Sreeramaneni | 326/30 |
| 2003/0085735 A1* | 5/2003 | Hagedorn | 326/56 |
| 2006/0126401 A1* | 6/2006 | Ba | 365/189.05 |
| 2007/0040573 A1* | 2/2007 | Batt | 326/30 |
| 2008/0258768 A1 | 10/2008 | Sreeramaneni | |

OTHER PUBLICATIONS

Micron Designline, "Graphics DDR3 On-Die Termination and Thermal Considerations", vol. 12, Issue 1, 1Q03/2Q03, quarterly pub, Micron Technology, Inc., Boise, ID, pp. 1-8. 2003 month n/a.

Micron Designline, "Calculating Memory System Power for DDR SDRAM", vol. 10, Issue 2, 2Q01, quarterly publication, Micron Technology, Inc., Boise, ID, pp. 1-12, 2001 month n/a.

* cited by examiner

Providing an input/output circuit on the electronic device comprising an output driver with an on die termination ODT leg having first tuning transistors, and a non-ODT leg having second tuning transistors.

Operating the output driver in a selected operational state.

Tristating selected tuning transistors in the ODT leg, the non-ODT leg, or both legs, as a function of the operational state of the ouput driver.

METHOD FOR OPERATING AN ELECTRONIC DEVICE WITH REDUCED PIN CAPACITANCE

CROSS REFERENCE TO RELATED APPLICATIONS

This application is a continuation of Ser. No. 11/738,473, filed Apr. 21, 2007, U.S. Pat. No. 7,482,833.

BACKGROUND

An electronic device, such as a memory device, includes on-chip circuits, such as memory circuits. The electronic device also includes terminal contacts for electrically connecting the on-chip circuits to external circuits, such as other components of a memory system. Physically, the terminal contacts can comprise balls, pins or leads formed on the outside of a semiconductor package containing the electronic device. Electrically, the terminal contacts are referred to as pins. In a memory device, the pins can include data (DQ) pins, address pins, and control pins, all of which are electrically connected to on-chip conductors (e.g., data lines, address lines, control lines). The pins transmit signals between the on-chip circuits on the memory device, and external circuits on another device, such as a processor or a controller.

In addition to memory circuits, the on-chip circuits in a memory device can include circuits for transmitting signals through the pins. For example, an input/output circuit can include output drivers configured to receive data bits from the memory circuits, and to transmit data signals from the memory circuits to the pins. The on-chip circuits can also include circuits for improving the electrical characteristics of the signals transmitted through the pins.

One electrical characteristic of the pins that can be controlled is the pin impedance. For example, an impedance calibration circuit can be used to tune various transistors in output drivers of the input/output circuit for selected pins of the memory device. The impedance calibration circuit can operate in concert with an ODT (on die termination) circuit to control on die termination impedances. Using these circuits, the impedance of one or more pins can be adjusted as a function of the impedance of an associated device such as a microprocessor (MPU). However, operation of these circuits also affects pin capacitance in the memory device.

Semiconductor manufacturers typically have pin capacitance specifications that insure the integrity of the signals transmitted through the pins. In general, high pin capacitance adversely affects signal integrity due to reflections. This is a particular problem at high speeds where impedance mismatches on signal transmission lines cause reflections. High pin capacitance also adversely affects system power, and slows down the edge rate of the signals, which reduces the data valid window. Meeting the tight pin capacitance specifications is becoming more challenging on current generation high speed memory devices, particularly at fast speed grades. For example, double data rate (DDR) memory devices, such as DDR3 memory devices manufactured by Micron Technology Inc. of Boise, Id., support data rates of 800-1600 Mbits/s and clock frequencies of 400 to 800 MHz. In these high speed memory devices, it is desirable to keep pin capacitance low, so that transmission signals can be efficiently processed by electronic elements receiving the signals.

In the art, various methods and circuits have been developed for controlling pin capacitance in electronic devices. For example, U.S. Pat. Nos. 7,151,700 and 7,164,600 to Ba describe a method and circuit for reducing pin capacitance in a memory device. With this method tuning transistors in ODT circuits are turned off during a default operational state (e.g., no data read operation occurring) to reduce DQ pin capacitance.

The present disclosure is directed to a method and circuit for controlling pin capacitance in an electronic device, without affecting the speed of the signals transmitted through the pins. In addition, by reducing DQ pin capacitance the present method and circuit allow circuits which share DQ pads to use more of the allowed pin capacitance budget, thereby permitting more robust designs, such as improved ESD (electrostatic discharge) circuits.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIG. 1 is a block diagram showing steps in a method for controlling pin capacitance in an electronic device;

DETAILED DESCRIPTION

As used herein, a tri-state component refers to an electronic component that includes a data input, a control input and an output. When the control input is active (1), the output is the input (1 or 0). When the control input is non-active (0), the output is completely disconnected and is termed "Z", "Hi-Z" or "High Impedance". The non-active state for a tri-state component is termed herein as the "tri-state". Other components in electrical communication with the tri-state component in a tri-state are also referred to as being "tri-stated". Tri-stating refers to the process of placing a tri-state component, or another component in electrical communication with the tri-state component, in a tri-state. For example, in the case of a tri-state inverter, tri-stating refers to the process of placing the inverter in a tri-state. In the case of a transistor in electrical communication with the tri-state inverter, tri-stating refers to the process of placing the inverter, and thus the gate of the transistor, in a tri-state.

Referring to FIG. 1, a method for controlling pin capacitance in an electronic device is illustrated in a block diagram. As shown in the upper block, the method includes the step of providing an input/output circuit on the electronic device comprising an output driver with an on die termination ODT leg having first tuning transistors, and a non-ODT leg having second tuning transistors. As shown in the middle block, the method also includes the step of operating the output driver in a selected operational state. As shown in the lower block, the method also includes the step of tri-stating selected tuning transistors in the ODT leg, the non-ODT leg, or both legs, as a function of the operational state of the output driver. In general, the tri-stating step is performed, such that when a leg is not being utilized, the tuning transistors in the unused leg are placed in a tri-state. As explained above, the tuning transistors are not actually tri-stated, but rather tri-state components in electrical communication with the tuning transistors are tri-stated, thereby tri-stating the gate of the tuning transistors.

Figure 2:
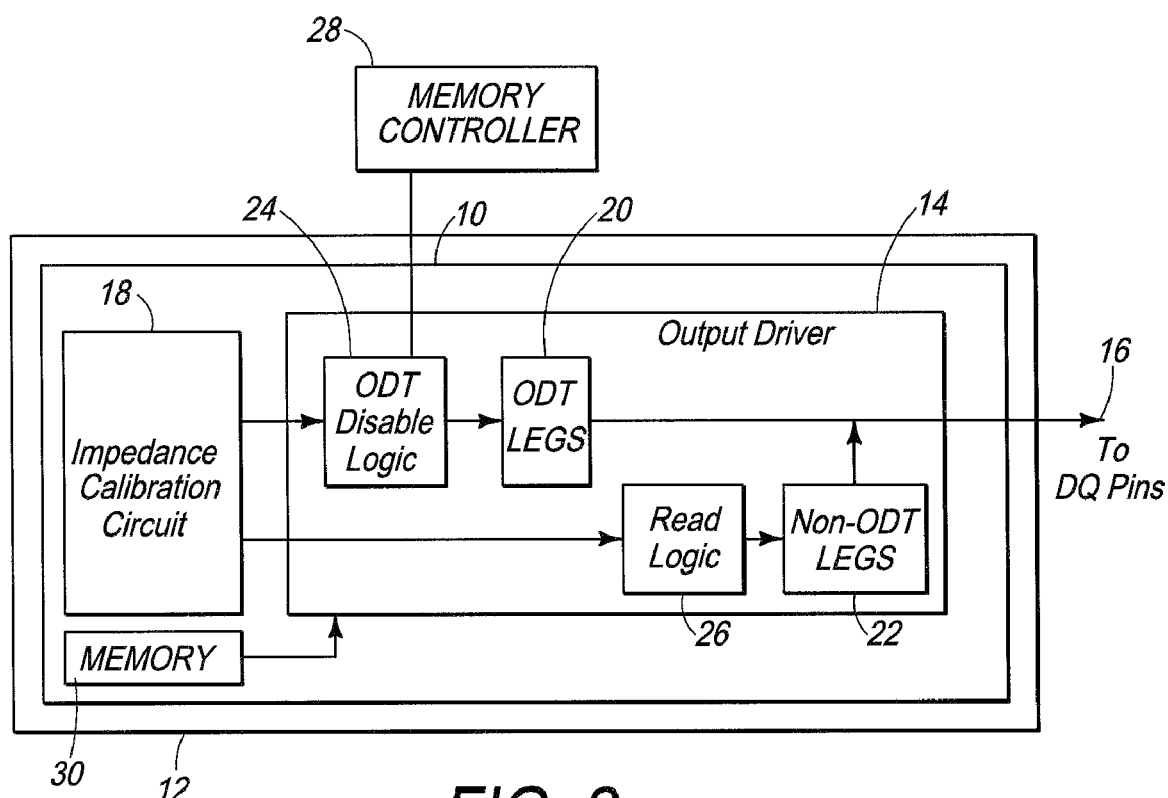
FIG. 2 is a block diagram of an input/output circuit for performing the method of FIG. 1.

Referring to FIG. 2, an input/output circuit 10 for an electronic device 12 configured to perform the method of FIG. 1 is illustrated. By way of example, the electronic device 12 can comprise a memory device, such as a DRAM (dynamic random access memory), a SRAM (static random access memory), a SDRAM (synchronous dynamic random access memory), a DDR SDRAM (double data rate DRAM), or a SGRAM (synchronous graphics random access memory). Alternately, the electronic device 12 can comprise any non-memory electronic device having an input/output circuit with ODT legs and non-ODT legs.

The input/output circuit 10 includes a DQ output driver 14 in electrical communication with DQ pins 16 for the electronic device 12. The DQ output driver 14 can be operated in three distinct operational states, which include READ, ODT and HiZ modes. These operational states determine the function of the DQ output driver 14. For example, during a READ mode, the DQ output driver 14 receives data signals, such as DQ out signals, from memory cells 30 of the electronic device 12.

The DQ output driver 14 also includes on die termination ODT legs 20 in electrical communication with ODT disable logic 24. The ODT legs 20 function to improve signal integrity by providing termination impedance for controlling reflected noise on transfer lines such as a memory controller. For example, the ODT legs 20 can be configured to receive externally supplied enable/disable signals from a device such as a memory controller 28. The DQ output driver 14 also include non-ODT legs 22 in electrical communication with read logic 26. The non-ODT legs 22 are also known as "read" legs.

The input/output circuit 10 also includes an impedance calibration circuit 18 in electrical communication with the DQ output driver 14. As will be further explained, the impedance calibration circuit 18 is configured to tune various transistors in the DQ output driver 14.

Figure 3:
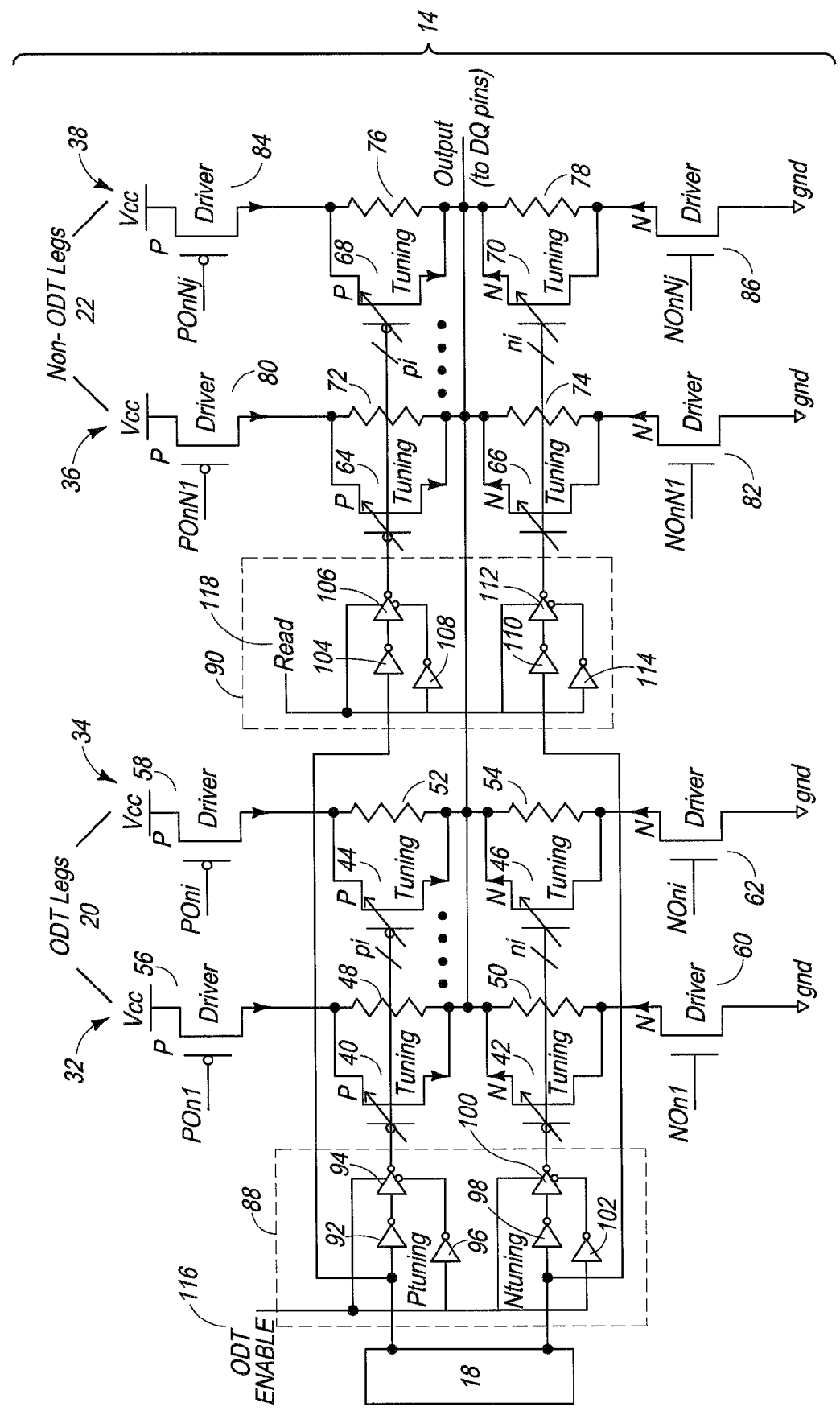
FIG. 3 is an electrical schematic showing components of the input/output circuit of FIG. 2.

Referring to FIG. 3, components of the output driver 14 are illustrated. As shown in FIG. 3, the output driver 14 is controlled by the impedance calibration circuit 18. The output driver 14 includes "p" circuits, which are the "upper arm" circuits in FIG. 3, and "n" circuits which are the "lower arm" circuits in FIG. 3. The "upper arm" circuits can be operated as "pull up" devices, and the "lower arm" circuits can be operated as "pull down" devices. There may be any number (pi) of upper arm circuits, and any number (ni) of lower arm circuits. In addition, the upper arm circuits and the lower arm circuits can be constructed using CMOS (complementary metal oxide semiconductor) fabrication techniques. In FIG. 3, positive supply voltage is indicated by Vcc, and ground is indicated by gnd.

The ODT legs 20 (FIG. 3) of the output driver 14 include a first ODT leg 32 and a second ODT leg 34. The ODT legs 32, 34 terminate corresponding DQ pins 16 (FIG. 2) at their respective IC output pads (not shown). The first ODT leg 32 (FIG. 3) of the output driver 14 includes a p-channel driver transistor 56 connected to Vcc, a p-channel tuning transistor 40 and associated resistor 48 in parallel, an n-channel tuning transistor 42 and associated resistor 50 in parallel, and an n-channel driver transistor 60 connected to ground (gnd). Each tuning transistor 40, 42 has its own control, which is individually controlled by the impedance calibration circuit 18. In the first ODT leg 32, the p-channel driver transistor 56 and the p-channel tuning transistor 40 can be operated as "pull up" devices. Conversely, the n-channel driver transistor 60 and the n-channel tuning transistor 42 can be operated as "pull down" devices.

The second ODT leg 34 (FIG. 3) of the output driver 14 includes a p-channel driver transistor 58 connected to Vcc, a p-channel tuning transistor 44 and associated resistor 52 in parallel, an n-channel tuning transistor 46 and associated resistor 54 in parallel, and an n-channel driver transistor 62 connected to ground (gnd). Each tuning transistor 44, 46 has its own control, which is individually controlled by the impedance calibration circuit 18. In the second ODT leg 34, the p-channel driver transistor 58 and the p-channel tuning transistor 44 can be operated as "pull up" devices. Conversely, the n-channel driver transistor 62 and the n-channel tuning transistor 46 can be operated as "pull down" devices.

In FIG. 3, the activation signals to "turn-on" the driver transistors in the ODT legs 20 are indicated as POn1 . . . POni for the p-channel drivers 56, 58, and NOn1 . . . NOni for n-channel drivers 60, 62. Further, techniques for generating and operating these activation signals are known in the art.

The non-ODT legs 22 (FIG. 3) of the output driver 14 include a first non-ODT leg 36 and a second non-ODT leg 38. The non-ODT legs 36, 38 terminate corresponding DQ pins 16 (FIG. 2) at their respective IC output pads (not shown). The first non-ODT leg 36 includes a p-channel driver transistor 80 connected to Vcc, a p-channel tuning transistor 64 and associated resistor 72 in parallel, an n-channel tuning transistor 66 and associated resistor 74 in parallel, and an n-channel driver transistor 82 connected to ground (gnd). Each tuning transistor 64, 66 has its own control, which is individually controlled by the impedance calibration circuit 18. In the first non-ODT leg 36, the p-channel driver transistor 80 and the p-channel tuning transistor 64 can be operated as "pull up" devices. Conversely, the n-channel driver transistor 82 and the n-channel tuning transistor 66 can be operated as "pull down" devices.

The second non-ODT leg 38 (FIG. 3) of the output driver 14 includes a p-channel driver transistor 84 connected to Vcc, a p-channel tuning transistor 68 and associated resistor 76 in parallel, an n-channel tuning transistor 70 and associated resistor 78 in parallel, and an n-channel driver transistor 86 connected to ground (gnd). Each tuning transistor 68, 70 has its own control, which is individually controlled by the impedance calibration circuit 18. In the second non-ODT leg 38, the p-channel driver transistor 84 and the p-channel tuning transistor 68 can be operated as "pull up" devices. Conversely, the n-channel driver transistor 86 and the n-channel tuning transistor 70 can be operated as "pull down" devices.

In FIG. 3, the activation signals to "turn-on" the driver transistors in the non-ODT legs 22 are indicated as POnN1 . . . POnNj for the p-channel drivers 80, 84, and NOnN1 . . . NOnNj for n-channel drivers 82, 86. Further, techniques for generating and operating these activation signals are known in the art.

The output driver 14 (FIG. 3) also includes an ODT enable logic unit 88 which controls the ODT legs 20 responsive to ODT enable signals 116, and a READ logic unit 90 which controls the non-ODT legs 22 responsive to READ signals 118. The upper arm (p-channel) of the ODT enable logic unit 88 includes a first inverter 92 connected in series to a tri-state inverter 94, and a second inverter 96 in parallel with the first inverter 92 having an output connected to an active low control port of the tri-state inverter 94. The lower arm (n-channel) of the ODT enable logic unit 88 also includes a first inverter 98 connected in series to a tri-state inverter 100, and a second inverter 102 in parallel with the first inverter 98 connected to an active low control port of the tri-state inverter 102.

The upper arm (p-channel) of the READ logic unit 90 includes a first inverter 104 connected in series to a tri-state inverter 106, and a second inverter 108 in parallel with the first inverter 106 having an output connected to an active low control port of the tri-state inverter 106. The lower arm (n-channel) of the READ logic unit 90 also includes a first inverter 110 connected in series to a tri-state inverter 112, and a second inverter 114 in parallel with the first inverter 110 connected to an active low control port of the tri-state inverter 112.

In accordance with the method of FIG. 1, the output driver 14 (FIG. 3) is operated such that the tuning transistors 40, 42, 44, 46, 72, 74, 76, 78 in any leg 32, 34, 36, 38 that is not being utilized is tri-stated. Table I identifies the operational modes of the output driver 14 and the status of the tuning transistors 40, 42, 44, 46, 72, 74, 76, 78 in the ODT legs 20 and the non-ODT legs 22.

TABLE I

| | STATUS OF TUNING TRANSISTORS (40, 42, 44, 46, 72, 74, 76, 78) | |
|---|---|---|
| Mode | ODT legs 20 | non-ODT legs 22 |
| ODT | Enabled | Tri-stated |
| READ | Tri-stated | Enabled |
| HiZ | Tri-stated | Tri-stated |

During operation of the output driver 14 (FIG. 3), an ODT enable signal (active High) applied to the ODT enable logic unit 88 (FIG. 3) will enable the tuning of the tuning transistors 40, 42, 44, 46 in the ODT legs 20 to obtain output data with correct impedance. At the same time, the tuning transistors 72, 74, 76, 78 in the non-ODT legs are tri-stated to reduce capacitance on corresponding DQ pins 16 (FIG. 2).

A READ signal (active High) applied to the READ logic unit 90 (FIG. 3) at the READ input 118 (FIG. 3) will enable the tuning of the tuning transistors 64, 66, 68, 70 in the non-ODT legs 22 to obtain output data with correct impedance. At the same time, the tuning transistors 40, 42, 44, 46 in the ODT legs 20 are tri-stated to reduce capacitance on corresponding DQ pins 16 (FIG. 2).

In a HiZ operational mode (active Low on both ODT enable logic unit 88 and READ logic unit 90) the tuning transistors 40, 42, 44, 46, 72, 74, 76, 78 in both the ODT legs 20 and the non-ODT legs 22 are tri-stated to reduce capacitance on corresponding DQ pins 16 (FIG. 2).

Table II identifies the signals applied to the ODT enable logic unit 88 (FIG. 3) and to the READ logic unit 90 (FIG. 3) and the corresponding operational modes of the output driver 14 (FIG. 3).

TABLE II

| | SIGNALS ON LOGIC UNITS 88, 90 | | |
|---|---|---|---|
| ODT Enable | READ | > | Mode |
| Low | Low | > | HiZ |
| Low | High | > | READ |
| High | Low | > | ODT |
| High | High | > | N/A (or ODT legs being used for READ) |

The ODT enable logic unit 88 and the READ logic unit 90 can be fabricated using conventional CMOS fabrication techniques using minimal amounts of chip real estate. This conserves chip real estate for other circuits. For example, electrostatic discharge (ESD) circuits can be made more robust due to chip real estate savings achieved by pin capacitance control circuits.

Figure 4:
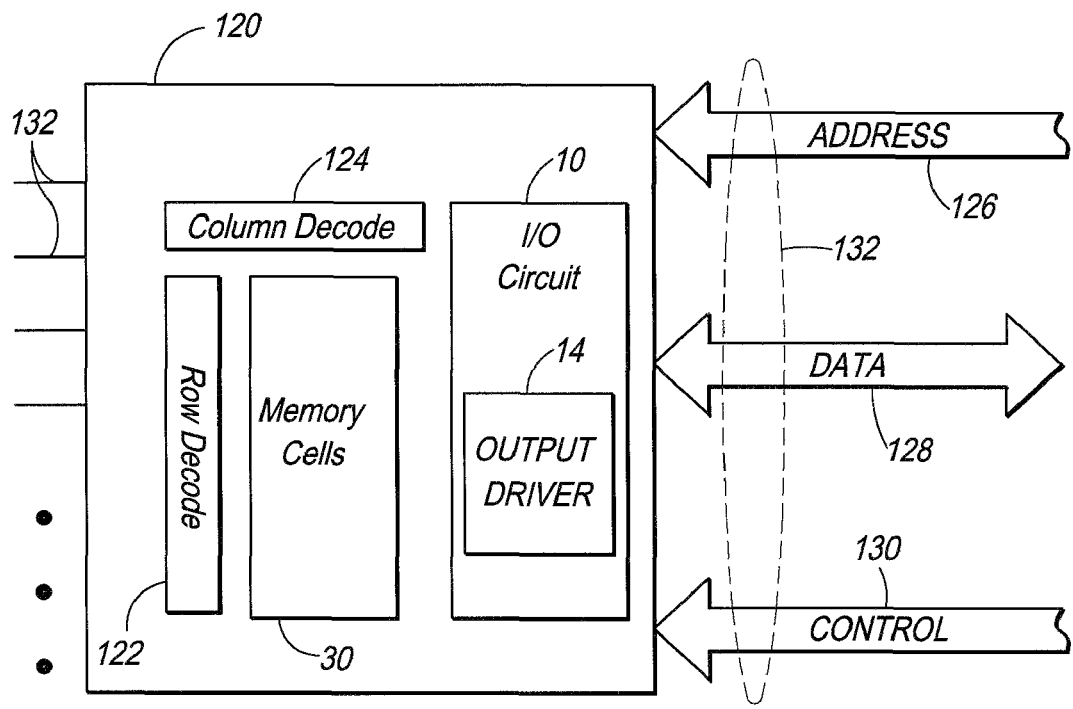
FIG. 4 is block diagram of a memory chip which includes the input/output circuit of FIG. 3.

Referring to FIG. 4, a memory device 120 that includes the input/output circuit 10 with the output driver 14 is illustrated. The memory device 120 can comprise any conventional memory device such as a DRAM (dynamic random access memory), a SRAM (static random access memory), a SDRAM (synchronous dynamic random access memory), a DDR SDRAM (double data rate DRAM), or a SGRAM (synchronous graphics random access memory). As a specific example, the memory device can comprise a DDR3 DRAM operating at a clock frequency of 400-800 MHz and a data I/O rate of 800-1600 Mbit/s.

The memory device 120 includes pins 132 such as an array of solder balls that function as terminal contacts for electrically connecting the memory device 120 to the outside world. The pins 132 can include an address bus 126, a data bus 128 and a control bus 130. The memory device 120 also includes memory cells 30 arranged in rows and columns configured to store data in rows and columns. The memory device also includes a row decode circuit 122 and a column decode circuit 124 configured to select rows and columns in the memory cells 30 responsive to decoding an address on the address bus 126. Using the method of FIG. 1, the output driver 14 can be operated to reduce pin capacitance in the memory device 120.

Figure 5:
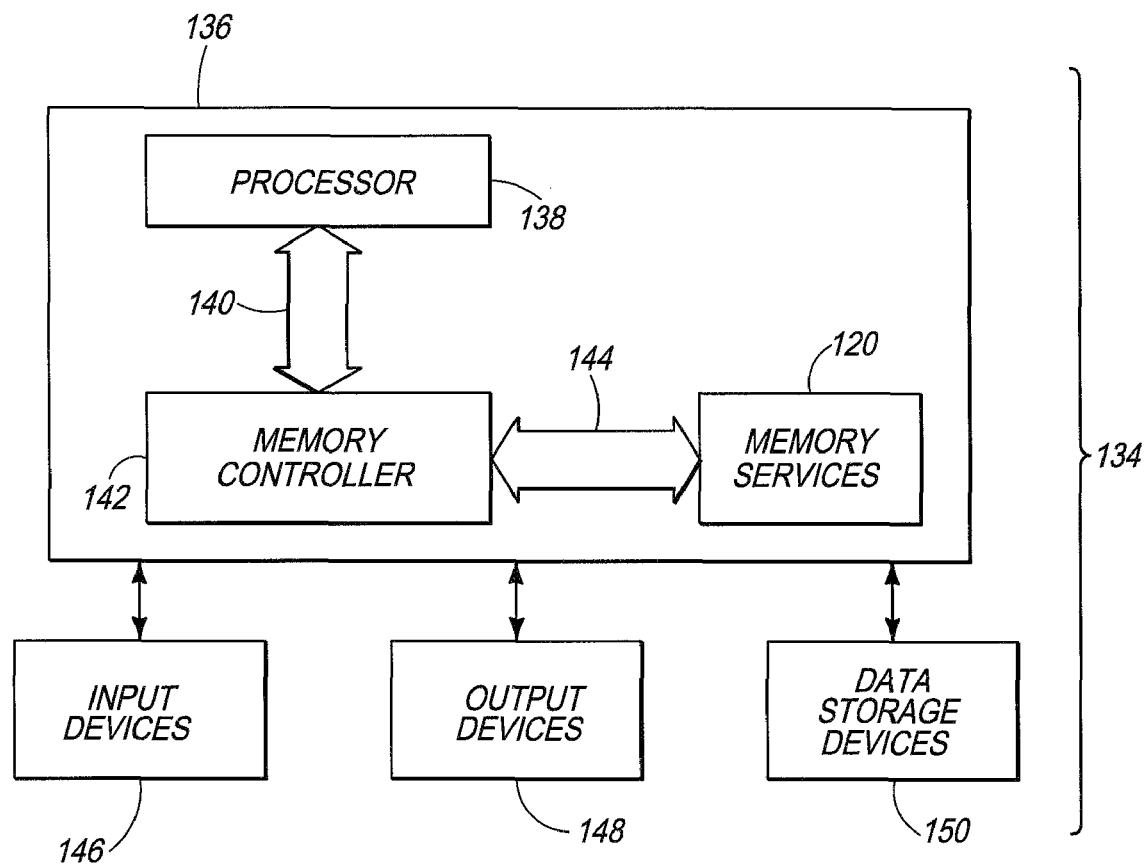
FIG. 5 is a block diagram of a system containing the memory chip of FIG. 4.

Referring to FIG. 5, a system 134 containing one or more memory devices 120 is illustrated. The system 134 includes a data processing unit 136 that includes a processor 138 for performing computing functions, such as executing specific software to perform specific calculations or data processing tasks. The data processing unit 136 also includes a memory controller 142 in electrical communication with the processor 138 via a bus 140. The bus 140 can include an address bus, a data bus and a control bus. The memory controller 142 is in electrical communication with the memory devices 120 via a second bus 144.

The system 134 (FIG. 5) also includes one or more input devices 146 (e.g., mouse or keyboard) in electrical communication with the data processing unit 136 which allows a user to manually input data. The system 134 also includes one or more output devices 148 in electrical communication with the data processing unit 136 configured to display or otherwise output data. The system 134 also includes one or more data storage devices 150 in electrical communication with the data processing unit 136 configured to store or retrieve data from internal or external storage devices.

The following disclosure (Case 1, Case 2, Case 3) illustrates the savings in pin capacitance (CAP) that can be achieved using the disclosed method and circuit 10. The MOSFET's referred to in this material are the ZQ trim devices corresponding to the tuning transistors 40, 42, 44, 46, 64, 66, 68, 70 in FIG. 3.

The following definitions apply:
Cgd—Gate-Drain overlap cap of MOSFET
Cgs—Gate-Source overlap cap of MOSFET
Cgb—gate-Channel cap of MOSFET
Cgpar—Parasitic cap on the gate of the MOSFET
Crest—Other cap components, such as junctions which are assumed constant below
Case 1: ZQ Trim Devices ON
Since the ZQ trim devices are ON, they have a full channel formed under the gate and therefore the cap loading the DQ pin is maximum which can be described as:

$$C\_DQ = Cgd + Cgs + Cgb + Crest$$

Case 2: ZQ Trim Devices OFF

If the ZQ trim devices are OFF, only the overlap cap loads the DQ pin which can be described as:

$$C\_DQ = Cgd + Cgs + Crest$$

Compared to Case 1, Case 2 results in a saving of Cgb in DQ pin cap. This can be a significant portion of the total capacitance depending on the process type and MOSFET dimensions.

Case 3: ZQ Trim Devices Tri-Stated (HiZ)

If the ZQ trim devices are tri-stated, then only the overlap cap in series with the parasitic gate cap of the MOSFET loads the DQ pin.

$$C\_DQ = ((Cgd + Cgs) * Cgpar)/(Cgd + Cgs + Cgpar)) + Crest$$

And, if the parasitic gate cap, Cgpar can be kept low, then the first term may become negligible, thereby approximating:

$$C\_DQ = Crest$$

Compared to Case 2, Case 3 results in additional saving of Cgd and Cgs in DQ pin cap. This can again be a significant portion of the total capacitance depending on the process type and MOSFET dimensions.

CONCLUSION

Tri-stating the ZQ trim devices in the unused output driver legs can reduce DQ pin capacitance by a total of approximately (Cgd+Cgs+Cgb) of the ZQ trim devices.

Shutting off the ZQ trim devices in the unused output driver legs can reduce DQ pin capacitance by a total of approximately (Cgb) of the ZQ trim devices.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

I claim:

1. A method of operating an electronic device having an input/output circuit including an output driver with an on die termination ODT leg having a first tuning transistor, and a non-ODT leg having a second tuning transistor comprising:
   operating the output driver in a selected operational state; and
   tri-stating the first tuning transistor, the second tuning transistor or both the first tuning transistor and the second tuning transistor with the driver active, and with the non-ODT leg enabled, as a function of the selected operational state using a first tri-state inverter in electrical communication with the first tuning transistor, and a second tri-state inverter in electrical communication with the second tuning transistor.

2. The method of claim 1 further comprising tri-stating the second tuning transistor with the ODT leg enabled during an ODT operational mode.

3. The method of claim 1 further comprising tri-stating the second tuning transistor during a HiZ operational mode.

4. The method of claim 1 wherein the tri-stating is performed with the driver in a READ operational state.

5. A method of operating an electronic device having an input/output circuit including an output driver with an on die termination ODT leg having a first tuning transistor in electrical communication with a first tri state inverter, and a non-ODT leg having a second tuning transistor in electrical communication with a second tri state inverter comprising;
   operating the output driver in a selected operational state; and
   tri-stating the first tuning transistor, the second tuning transistor, or both the first tuning transistor and the second tuning transistor, as a function of the selected operational state using the first tri-state inverter, the second tri-state inverter or both the first tri-state inverter and the second tri-state inverter.

6. The method of claim 5 further comprising tri-stating both the first tuning transistor and the second tuning transistor with the ODT leg and the non-ODT leg in a HiZ mode.

7. A method of operating an electronic device having an input/output circuit including an output driver with an on die termination ODT leg having at least one first tuning transistor, and a non-ODT leg having at least one second tuning transistor comprising;
   operating the output driver in an ODT operational state wherein the ODT leg is enabled, and in a READ operational state wherein the non-ODT leg is enabled;
   tri-stating the second tuning transistor during the ODT operational state; and
   tri-stating the first tuning transistor during the READ operational state using at least one first tri-state inverter in electrical communication with the first tuning transistor.

8. The method of claim 7 further comprising tri-stating both the first tuning transistor and the second tuning transistor during a HiZ operational state wherein neither the ODT leg or the non-ODT leg are enabled.

9. A method of operating an electronic device having an input/output circuit including an output driver with an on die termination ODT leg having at least one first tuning transistor, and a non-ODT leg having at least one second tuning transistor comprising;
   operating the output driver in an ODT operational state wherein the ODT leg is enabled, and in a READ operational state wherein the non-ODT leg is enabled;
   tri-stating the second tuning transistor during the ODT operational state using at least one second tri-state inverter in electrical communication with the second tuning transistor; and
   tri-stating the first tuning transistor during the READ operational state.

10. The method of claim 9 wherein the tri-stating the first tuning transistor is performed using at least one first tri-state inverter in electrical communication with the first tuning transistor.

11. The method of claim 10 further comprising tri-stating both the first tuning transistor and the second tuning transistor during a HiZ operational state wherein neither the ODT leg or the non-ODT leg are enabled.

12. A method of operating an electronic device having a plurality of DQ pins including an output driver in electrical communication with the DQ pins having a first leg and a second leg for controlling DQ signals comprising:
   providing a first tri-state component comprising a first tri-state inverter in the first leg in electrical communication with a first tuning transistor in the first leg;
   providing a second tri-state component comprising a second tri-state inverter in the second leg in electrical communication with a second tuning transistor in the second leg;
   tri-stating the first tri-state component with the second leg enabled; and tri-stating the second tri-state component with the first leg enabled.

13. The method of claim 12 further comprising tri-stating both the first tri-state component and the second tri-state component with neither the first leg or the second leg enabled.

14. The method of claim 12 wherein the first leg comprises an on die termination ODT leg.

15. The method of claim 12 wherein the second leg comprises a non on die termination leg.

16. The method of claim 12 wherein the electronic device comprises a non-memory electronic device.

17. The method of claim 12 wherein the electronic device comprises a memory device.

18. The method of claim 12 wherein the electronic device is in electrical communication with at least one data storage device.

19. The method of claim 12 wherein the electronic device comprises a device selected from the group consisting of a DRAM (dynamic random access memory), a SRAM (static random access memory), a SDRAM (synchronous dynamic random access memory), a DDR SDRAM (double data rate DRAM), or a SGRAM (synchronous graphics random access memory).

20. The method of claim 12 wherein the electronic device comprises a DDR3 DRAM operating at a selected clock frequency and a selected data I/O rate.

* * * * *